(12) United States Patent
Park et al.

(10) Patent No.: US 10,298,199 B2
(45) Date of Patent: May 21, 2019

(54) ACOUSTIC WAVE DEVICE AND METHOD FOR MANUFACTURING THE SAME

(71) Applicant: Samsung Electro-Mechanics Co., Ltd., Suwon-si (KR)

(72) Inventors: Seung Wook Park, Suwon-si (KR); Tae Sung Jeong, Suwon-si (KR); No Il Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 103 days.

(21) Appl. No.: 15/370,104

(22) Filed: Dec. 6, 2016

(65) Prior Publication Data
US 2017/0288645 A1 Oct. 5, 2017

(30) Foreign Application Priority Data
Mar. 30, 2016 (KR) .................. 10-2016-0038205

(51) Int. Cl.
*H03H 9/10* (2006.01)
*H03H 3/08* (2006.01)
*H03H 3/02* (2006.01)

(52) U.S. Cl.
CPC ............ *H03H 9/1014* (2013.01); *H03H 3/02* (2013.01); *H03H 3/08* (2013.01); *H03H 9/1071* (2013.01)

(58) Field of Classification Search
CPC .. H03H 9/1092; H03H 9/1071; H03H 9/1014; H03H 3/08; H03H 3/02

USPC .......................... 333/133, 187, 188, 193–196
See application file for complete search history.

(56) References Cited

U.S. PATENT DOCUMENTS

| | | | | |
|---|---|---|---|---|
| 6,329,739 B1 * | 12/2001 | Sawano | ............... | H03H 9/1071 310/313 R |
| 6,388,545 B1 * | 5/2002 | Kawachi | ................ | H03H 9/059 310/313 B |
| 6,573,635 B2 | 6/2003 | Suga et al. | | |
| 2011/0080234 A1 | 4/2011 | Haruta | | |
| 2017/0250669 A1 * | 8/2017 | Kuroyanagi | ....... | H03H 9/02559 |

FOREIGN PATENT DOCUMENTS

| | | |
|---|---|---|
| JP | 2007-324162 A | 12/2007 |
| WO | WO 2008/038498 A1 | 4/2008 |
| WO | WO 2009/153916 A1 | 12/2009 |

* cited by examiner

*Primary Examiner* — Robert J Pascal
*Assistant Examiner* — Jorge L Salazar, Jr.
(74) *Attorney, Agent, or Firm* — NSIP Law

(57) ABSTRACT

An acoustic wave device includes: a substrate; an acoustic wave generating part disposed on a surface of the substrate; a ground pad disposed on the surface of the substrate; a support part spaced apart from the acoustic wave generating part on the surface of the substrate; a shielding member disposed on the support part, and spaced apart from the acoustic wave generating part; and a ground terminal disposed on the ground pad, wherein the ground pad and the shielding member are electrically connected to each other through the ground terminal.

18 Claims, 8 Drawing Sheets

ACOUSTIC WAVE DEVICE AND METHOD FOR MANUFACTURING THE SAME

CROSS-REFERENCE TO RELATED APPLICATIONS

This application claims the benefit under 35 USC 119(a) of Korean Patent Application No. 10-2016-0038205 filed on Mar. 30, 2016 in the Korean Intellectual Property Office, the entire disclosure of which is incorporated herein by reference for all purposes.

BACKGROUND

1. Field

The following description relates to an acoustic wave device and a method of manufacturing an acoustic wave device.

2. Description of Related Art

A band pass filter is a key component of a communications device that selects only a signal within a required frequency band, among various frequency bands, to transmit and receive the selected signal. Representative examples of a band pass filter include a surface acoustic wave (SAW) filter and a bulk acoustic wave (BAW) filter.

In such an acoustic wave device, a filter generally includes a resonance element having a thin film form. The resonance element may be formed by depositing an interdigital transducer (IDT) electrode or a piezoelectric dielectric material on a wafer substrate. Piezoelectric characteristics of the deposited IDT electrode or the piezoelectric dielectric material are used to cause resonance.

Applications of such an acoustic wave device include, for example, a mobile communications device, a small and lightweight filter of a chemical device or a biological device, an oscillator, a resonance element, and an acoustic resonance mass sensor.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave device includes: a substrate; an acoustic wave generating part disposed on a surface of the substrate; a ground pad disposed on the surface of the substrate; a support part spaced apart from the acoustic wave generating part on the surface of the substrate; a shielding member disposed on the support part, and spaced apart from the acoustic wave generating part; and a ground terminal disposed on the ground pad, wherein the ground pad and the shielding member are electrically connected to each other through the ground terminal.

The support part may be disposed between the ground pad and the shielding member.

The ground terminal may include a solder bump or a solder ball.

The ground terminal may include: a connection conductor disposed on the ground pad in pillar form; and a terminal part disposed at an end of the connection conductor.

The shielding member may be bonded to the connection conductor.

The acoustic wave device may further include a sealing part disposed along surfaces of the shielding member and the support part.

The shielding member may include a portion exposed externally of the sealing part. The ground terminal may be bonded to the portion exposed externally of the sealing part.

The shielding member may include a ring-shaped connection part having a through-hole. The ground terminal may be received in the through-hole, and may be electrically connected to the connection part.

In another general aspect, a method to manufacture an acoustic wave device includes: forming an acoustic wave generating part and a ground pad on a surface of a substrate; forming a support part to be spaced apart from the acoustic wave generating part on the surface of the substrate; disposing a shielding member on the support part; and attaching a ground terminal to the ground pad and the shielding member.

The forming of the support part may include disposing the support part partially on the ground pad such that a portion of the ground pad is exposed externally of the support part.

The method may further include, after the disposing of the shielding member on the support part, forming a sealing part along surfaces of the shielding member and the support part.

The forming of the sealing part may include removing a portion of the sealing part to expose a portion of the shielding member externally of the sealing part. The ground terminal may be attached to the portion of the shielding member.

The forming of the shielding member may include forming the shielding member such that a portion of the shielding member protrudes externally of the support part over the ground pad.

The forming of the ground terminal may include: disposing a conductive member on the ground pad; and melting and curing the conductive member.

The forming of the ground terminal may include: disposing a connection conductor having a pillar form on the ground pad; and forming a terminal part at an end of the connection conductor.

In another general aspect, a method to manufacture an acoustic wave device includes forming an acoustic wave generating part and a ground pad on a surface of a substrate; forming a connection conductor having a pillar form on the ground pad; forming a support part to be spaced apart from the acoustic wave generating part on the surface of the substrate; disposing a shielding member on the support part and connecting the shielding member to the connection conductor; and forming a terminal part at an end of the connection conductor.

The disposing of the shielding member on the support part may include positioning the shielding member to be spaced apart from the acoustic wave generating part in a direction perpendicular to the surface of the substrate.

Other features and aspects will be apparent from the following detailed description, the drawings, and the claims.

Figure 1:
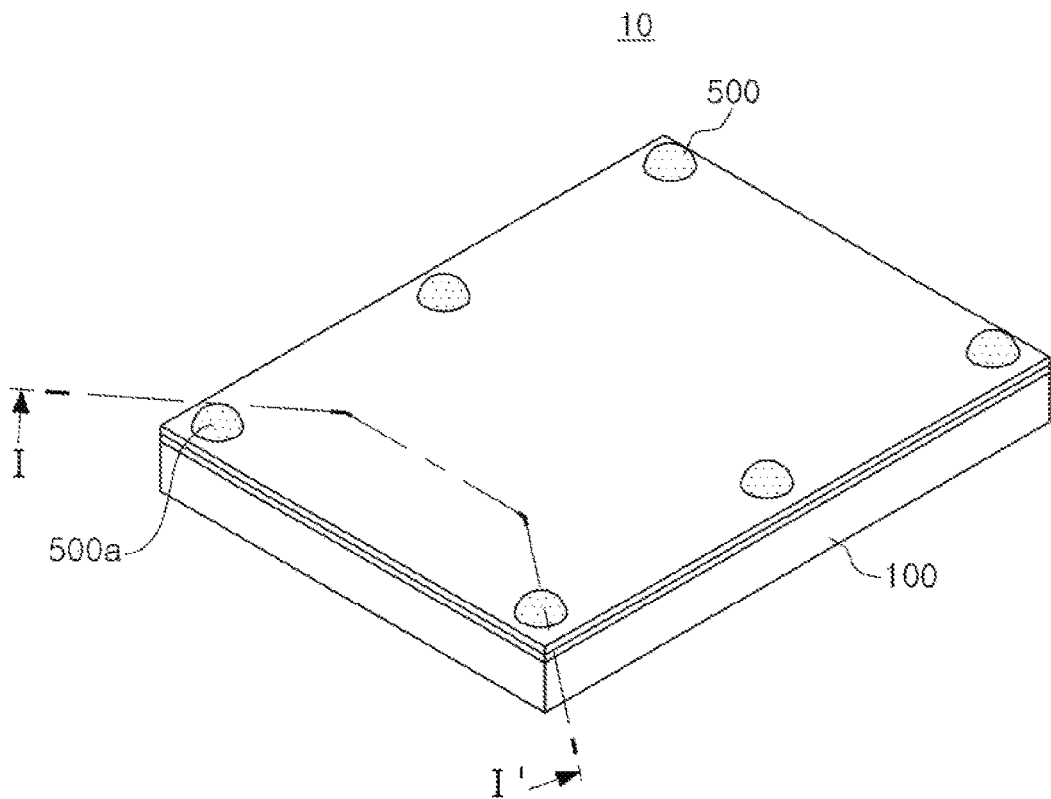
FIG. 1 is a perspective view of an acoustic wave device, according to an embodiment.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In addition, an acoustic wave device according to the following description includes a filter element configured to pass an approved frequency band, such as a surface acoustic wave (SAW) filter, a bulk acoustic wave (BAW) filter, or a duplexer.

Figure 2:
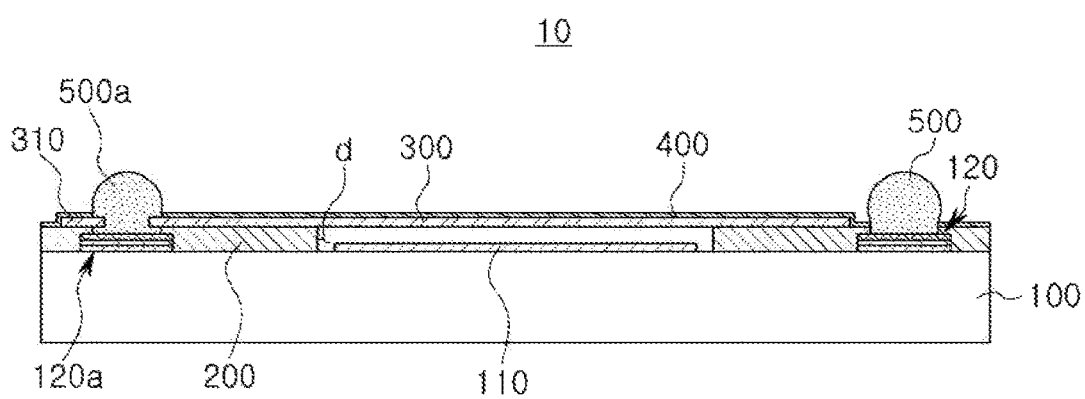
FIG. 2 is a cross-sectional view taken along a line I-I' of FIG. 1.
Figure 3:
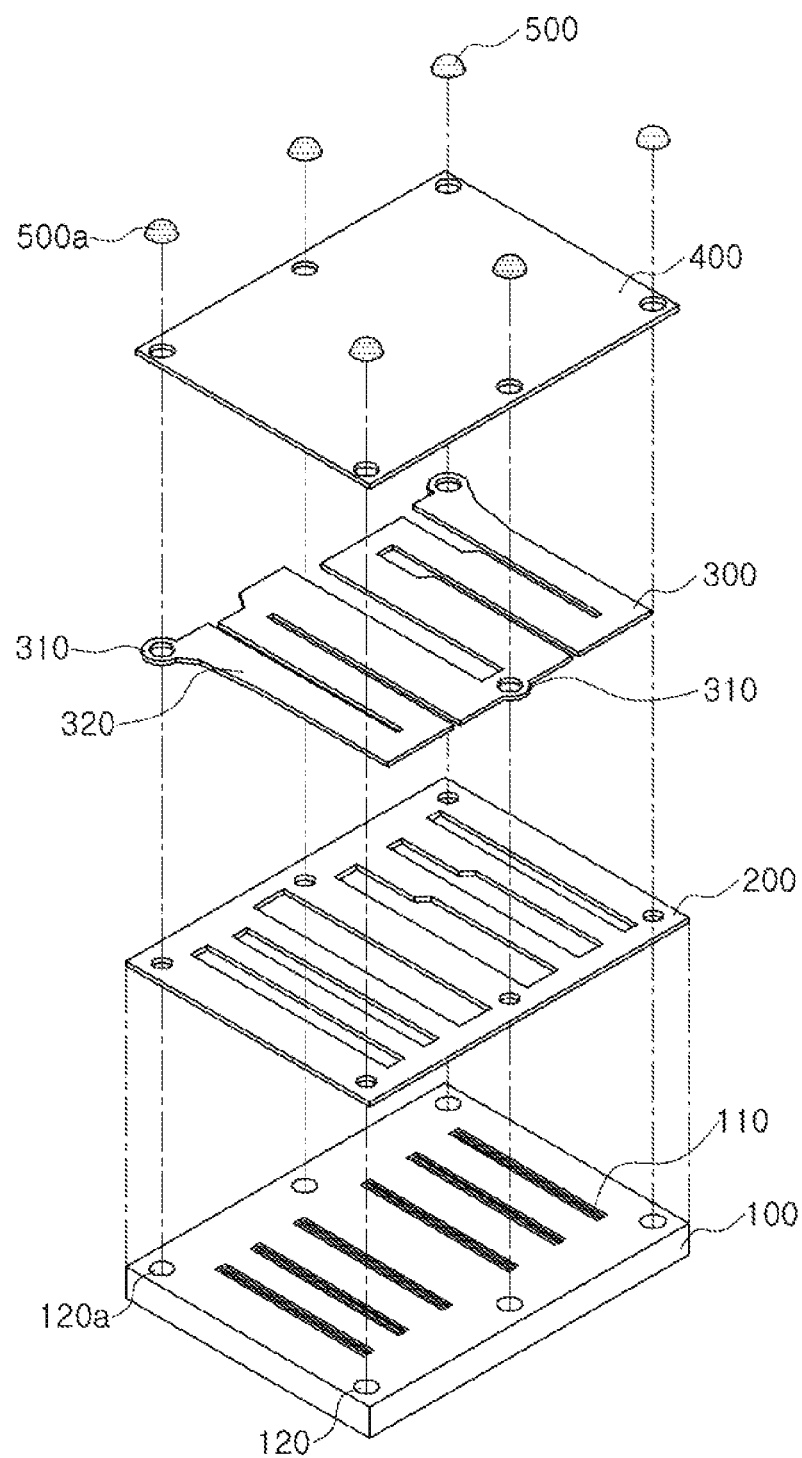
FIG. 3 is an exploded perspective view of the acoustic wave device illustrated in FIG.

FIG. 1 is a perspective view of an acoustic wave device 10, according to an embodiment. FIG. 2 is a cross-sectional view taken along a line I-I' of FIG. 1. FIG. 3 is an exploded perspective view of the acoustic wave device 10.

Referring to FIGS. 1 through 3, the acoustic wave device 10 includes a substrate 100, a support part 200, a shielding member 300, a sealing part 400, and connection terminals 500 and 500a.

In a case in which the acoustic wave device 10 is a SAW filter, the substrate 100 may be provided as a piezoelectric substrate. In a case in which the acoustic wave device 10 is a BAW filter, an Si substrate may be used.

For example, the substrate 100 is formed of a piezoelectric single crystal such as $LiTaO_3$, $LiNbO_3$, $Li_2B_4O_7$, or crystal, PZT based polycrystal, or a ZnO thin film. In addition, a wafer substrate formed of $SiO_2$ or silicon may be used for the substrate 100. However, the substrate used for the acoustic wave device 10 is not limited to the above-mentioned examples, and may be any one of various substrates which are used in the art.

As shown in FIGS. 2 and 3, an acoustic wave generating part 110 is disposed on one surface of the substrate 100.

For example, in a case in which the acoustic wave device 10 is a SAW filter, the acoustic wave generating part 110 is provided in a form of a metal electrode as illustrated in FIG.

3. The acoustic wave generating part 110 may be formed of aluminum or copper, and may include an interdigital transducer (IDT) electrode in which electrodes alternately intersect each other in a comb form.

In this case, the acoustic wave generating part 110 is constructed by forming a metal layer on the substrate 100 and machining the metal layer into a predetermined electrode form by a photolithography method. The acoustic wave generating part 110 may be formed of a metal such as gold (Au), platinum (Pt), aluminum (Al) or copper (Cu), or an alloy of any combination of two or more of Au, Pt, Al and Cu. In addition, the acoustic wave generating part 110 may be formed by stacking metal films.

In a case in which the acoustic wave device 10 is a BAW filter, the acoustic wave generating part 110 may be provided by forming a different structure than the structure employed in the SAW filter. For example, a piezoelectric thin film resonator configured to convert an electrical signal into a mechanical signal or to convert a mechanical signal into an electrical signal may be provided as the acoustic wave generating part 110. In this case, the acoustic wave generating part 110 forms a resonating part that is constructed by sequentially stacking a lower electrode, a piezoelectric layer, and an upper electrode on the substrate 100.

Electrode pads 120 and wiring patterns (not shown) electrically connecting the electrode pads 120 and the acoustic wave generating part 110 to each other are formed, for example, on the one surface of the substrate 100. Additionally, one or more ground pads 120a and wiring patterns (not shown) electrically connecting the one or more ground pads 120a and the acoustic wave generating part 110 to each other are formed, for example, on the one surface of the substrate 100.

The electrode pads 120 and the one or more ground pads 120a may be disposed at the outside of the acoustic wave generating part 110. Connection terminals 500 are disposed on the electrode pads 120, and one or more ground terminals 500a are disposed on the one or more ground pads 120a. The one or more ground pads 120a are electrically connected to a ground of the substrate 100, and are bonded to one or more ground terminals 500a described below.

Although FIGS. 1 and 2 illustrate a case in which the electrode pads 120 and the one or more ground pad 120a are classified as different pads, the electrode pads 120 and the one or more ground pads 120a may have a similar construction. The electrode pads 120 merely indicate pads that are used in a manner conceptually opposite to the one or more ground pads 120a, and the electrode pads 120 include pads other than the one or more ground pads 120a.

An insulating protection layer (not shown) that electrically insulates the acoustic wave generating part 110 and the wiring patterns from the outside environment may be disposed on the acoustic wave generating part 110 and the wiring patterns. However, the electrode pads 120 may be exposed externally of the insulating protection layer. The insulating protection layer may be formed of $SiO_2$ film, but is not limited to such a material.

The support part 200 is disposed on the one surface of the substrate 100, and is spaced apart from the acoustic wave generating part 110, in a direction perpendicular to the one surface of the substrate 100, by a predetermined distance. For example, the support part 200 is vertically spaced from the one surface of the substrate 100 by the predetermined distance.

The support part 200 may be continuously formed to surround a circumference of the acoustic wave generating part 110 along an edge of the acoustic wave generating part 110. For example, the support part 200 is configured in the form continuously surrounding the circumference of the acoustic wave generating part 110, while being spaced apart from the acoustic wave generating part 110 by the predetermined distance (e.g., 3 μm or more).

The support part 200 may have a thickness in the vertical direction that is greater than a thickness of the acoustic wave generating part 110 in the vertical direction. Accordingly, a gap is formed between the shielding member 300, which is seated on the support part 200, and the acoustic wave generating part 110.

A structure of the support part 200 is not limited to the above-described configuration, and may be changed in various ways as long as it is a structure that forms a gap between the shielding member 300 and the acoustic wave generating part 110.

The support part 200 may be formed of an insulating material such as a resin or polymer. However, the material of the support part 200 is not limited to the foregoing examples, and in a case in which the support part 200 is sufficiently spaced apart from the acoustic wave generating part 110 or insulation is provided between the support part 200 and the acoustic wave generating part 110, the support part 200 may also be formed of a metal material.

The support part 200 supports the shielding member 300. The support part 200 also spaces the acoustic wave generating part 110 and the shielding member from each other so that the acoustic wave generating part 110 is not in contact with the shielding member 300 when the acoustic wave generating part 110 resonates and is modified. Accordingly, a spacing region d is formed between the acoustic wave generating part 110 and the shielding member 300 by the support part 200, and the spacing region d is used as a modification space of the acoustic wave generating part 110 when the acoustic wave device 10 is driven.

The shielding member 300 may be formed to fully cover an upper portion of the acoustic wave generating part 110, and serves to shield electromagnetic waves. Therefore, the shielding member 300 is electrically connected to the ground terminal 500a, and is formed of a conductive metal material.

In addition, the shielding member 300 serves to prevent the sealing part 400 from being displaced toward the spacing region d and into contact with the acoustic wave generating part 110 due to external force in a manufacturing process. Accordingly, the shielding member 300 may have a flat plate form, and may be formed of a conductive metal plate (e.g., a copper plate) to provide rigidity.

The shielding member 300 includes a shielding part 320 disposed over the acoustic wave generating part 110, and one or more connection parts 310 disposed over the one or more ground pads 120a, as illustrated in FIG. 3.

The connection part 310 is extended from the shielding part 320 in the area over the ground pad 120a, and may be formed in a ring shape in which a through-hole is formed. The connection part 310 is disposed over the ground pad 120a to be bonded to the ground terminal 500a. To this end, the ground terminal 500a may extend through the through-hole in the connection part 310. However, the shape of the connection part 310 is not limited to the foregoing description, and the connection part 310 may be formed in various shapes as long as it can be easily bonded to the ground terminal 500a on the ground pad 120a.

After the shielding member 300 is separately manufactured, the shielding member 300 is transferred to the support part 200 to be bonded onto the support part 200. However, the shielding member 300 is not limited to the foregoing example, and may have a different configuration and/or may be attached to the support part in a different manner. For example, the shielding member 300 may be formed by directly stacking a metal plate on the support part 200 and patterning the stacked metal plate.

The shielding member 300 and the support part 200 are sealed by the sealing part 400. The sealing part 400 is disposed along surfaces of the shielding member 300 and the support part 200 to prevent an invasion of humidity and foreign materials into the spacing region d by sealing the shielding member 300 and the support part 200.

The sealing part 400 may be formed of a thin film layer including an insulating material. For example, the sealing part 400 may be formed of a thin film layer including any one or any combination of two or more of silicon nitride ($Si_xN_y$), silicon dioxide ($SiO_2$), silicon oxy-nitride ($SiO_xN_y$), and silicon carbide (SiC).

Although FIGS. 1 and 3 illustrate the sealing part 400 as having a form of a flat sheet, the illustrated configuration is merely for convenience of explanation. The sealing part 400 may be bent so as to correspond to the shape of the shielding member 300.

The connection terminals 500 and the one or more ground terminals 500a may be formed in a form of a solder ball or a solder bump, but are not limited to these examples.

The connection terminals 500 are bonded to the electrode pads 120 to electrically and mechanically connect a package substrate 2 (FIG. 9) and the acoustic wave device 10 to each other. The one or more ground terminals 500a are disposed on the respective one or more ground pads 120a.

Although FIG. 3 illustrates a case in which the connection terminals 500 and the one or more ground terminals 500a are classified as different terminals, the connection terminals 500 and the one or more ground terminals 500a may have a similar construction. The connection terminals 500 merely indicate terminals that are used in a manner conceptually opposite to the one or more ground terminals 500a, and the connection terminals 500 include terminals other than the one or more ground terminals 500a.

The one or more ground pads 120a and the shielding member 300 may be electrically connected through the one or more ground terminals 500a. Therefore, a ground terminal 500a serves as an external connection terminal, and also serves as a circuit wiring electrically connecting the ground pad 120a and the shielding member 300 to each other at the same time.

The support part 200 partially covers an upper surface of the ground pad 120a. In addition, a portion of the connection part 310 is positioned over the ground pad 120a. Accordingly, the support part 200 is partially interposed between the ground pad 120a and the shielding member 300.

In addition, at least a portion of the connection part 310 is exposed externally of the sealing part 400. Thereby, since a bonding surface between the ground terminal 500a and the shielding member 300 is extended, bonding reliability is increased.

Figure 4:
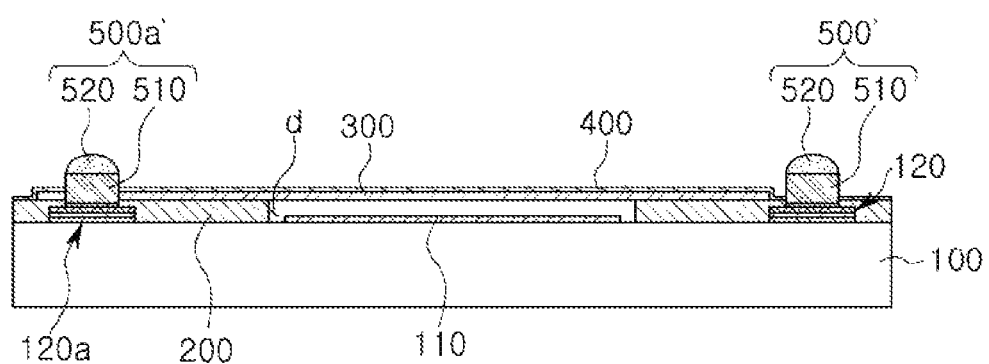
FIG. 4 is a cross-sectional view of an acoustic wave device, according to another embodiment.

FIG. 4, is a cross-sectional view of an acoustic wave device 10a, according to another embodiment, which illustrates a cross section corresponding to the line I-I' of FIG. 1. Referring to FIG. 4, a connection terminal 500' of the acoustic wave device 10a includes a connection conductor 510 and a terminal part 520.

The connection conductor 510 has a pillar form and is disposed on the electrode pad 120. In addition, the terminal part 520 is disposed at an end of the connection conductor 510. The acoustic wave device 10a further includes a ground terminal 500a' which is similar in construction to the connection terminal 500', and includes the terminal part 520 disposed on the ground pad 120a.

The shielding member 300 is connected to the connection conductor 510 of the ground terminal 500a'. Therefore, the shielding member 300, the ground pad 120a, and the terminal part 520 of the ground terminal 500a' are electrically connected to one another by the connection conductor 510 of the ground terminal 500a'.

The above-described configuration may be applied to the acoustic wave device 10a in which an interval between the connection terminals 500' or the ground terminals 500a' is narrower than an interval between the connection terminals 500 or the ground terminals 500a in the embodiment of FIGS. 1-3. This will again be described in a method of manufacturing the acoustic wave device 10a to be described below.

Next, a method for manufacturing the acoustic wave device 10, according to an embodiment, will be described with reference to FIGS. 5 and 6.

Figure 5:
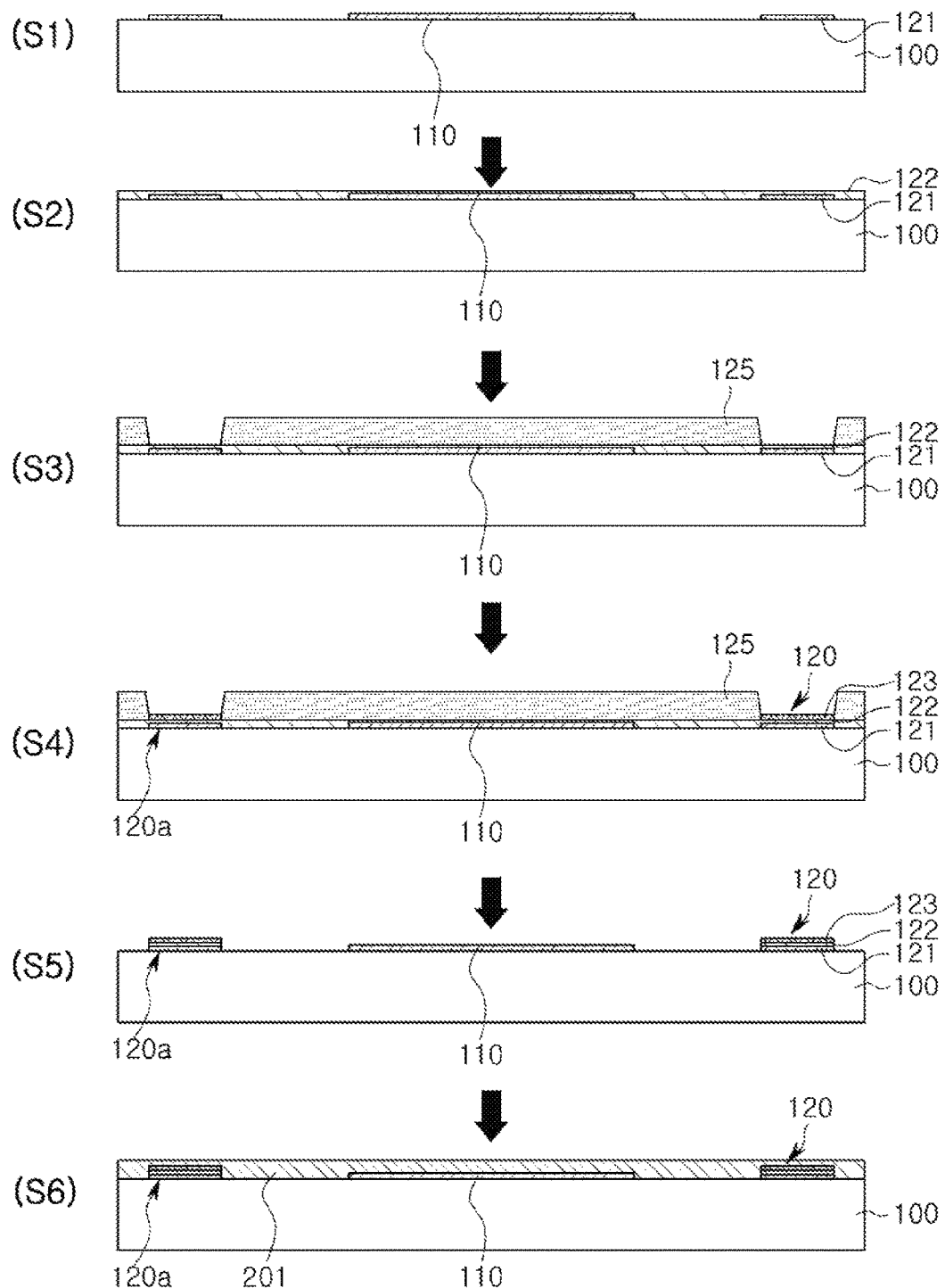
FIGS. 5 and 6 are views illustrating a method of manufacturing the acoustic wave device illustrated in FIG. 1, according to an embodiment.
Figure 6:
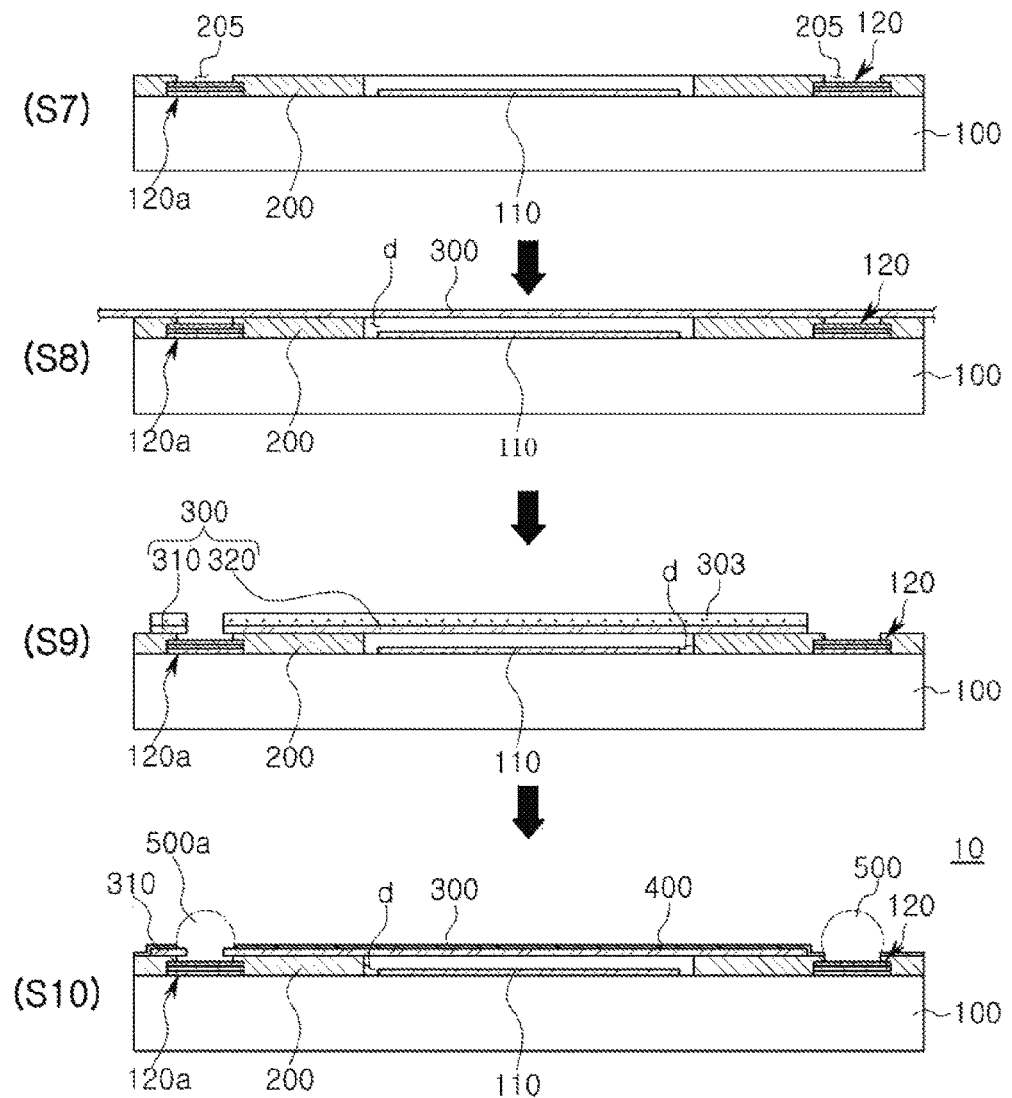

Referring to FIGS. 5 and 6, in a first operation (51), the acoustic wave generating part 110 is formed on the substrate 100. The acoustic wave generating part 110 is formed by forming a conductor layer on the substrate 100 and machining the conductor layer into a predetermined electrode form by a photolithography process. As described above, in the case of an SAW filter, the substrate 100 may be a piezoelectric substrate, and in the case of a BAW filter, the substrate 100 may be an Si substrate.

In a case in which the acoustic wave device 10 is to be used as a SAW filter, the acoustic wave generating part 110 may be formed of aluminum or copper, and may be formed in a structure in which electrodes intersect each other in a comb form. In this case, the acoustic wave generating part 110 may be provided by forming the conductor layer on the substrate 100 and machining the conductor layer into a predetermined electrode form by a photolithography method.

In addition, in a case in which the acoustic wave device 10 is to be used as a BAW filter, the acoustic wave generating part 110 may be formed on one surface of the substrate 100 as a separate structure in which an lower electrode, a piezoelectric layer, and an upper electrode are sequentially stacked.

Wiring patterns which are electrically connected to the acoustic wave generating part 110 are formed around the acoustic wave generating part 110. In addition, the wiring patterns include wiring layers 121 which are subsequently formed as the electrode pad 120 and the ground pad 120a.

An insulating protection layer (not shown), such as an $SiO_2$ film, may be disposed on surfaces of the acoustic wave generating part 110 and the wiring patterns. In this case, the wiring layers 121 may be exposed externally of the insulating protection layer.

Next, in operation (S2), a seed layer 122 is formed on the acoustic wave generating part 110 and the wiring layers 121. The seed layer 122 may be formed to perform electroplating, and may be formed of a copper (Cu) material by a sputtering method. However, the seed layer 122 is not limited to these examples.

The insulating protection layer may be formed on the acoustic wave generating part 110. Therefore, the seed layer 122 may be formed on a surface of the insulating protection layer, and the exposed wiring layer 121 of the insulating protection layer.

Next, in operation (S3), a mask layer 125 is formed on the seed layer 122, and a portion of the mask 125 is then removed so that a portion of the seed layer 122 is exposed.

In this case, a region of the seed layer 122 corresponding to the wiring layer 121 is exposed.

Next, in operation (S4), a plating layer 123 is formed on the exposed seed layer 122 to form a shape of the electrode pad 120 and the ground pad 120a. The plating layer 123 may be formed by electroplating using the seed layer 122. However, the plating layer 123 is not limited to being formed by electroplating. The plating layer 123 may also be formed by using electroless plating, as needed.

The plating layer 123 may be formed by sequentially stacking a nickel (Ni) layer and a gold (Au) layer on the seed layer 122, and may be used as an under barrier metal (UBM) layer. However, the plating layer 123 is not limited to such an example.

Next, in operation (S5), the remainder of the mask layer 125 and portions of the seed layer 122 are removed. In particular, portions of the seed layer 122 formed on regions other than the electrode pad 120 and the ground pad 120a are removed. Accordingly, the electrode pad 120, the ground pad 120a and the acoustic wave generating part 110 are completed on the substrate 100.

In the case in which the acoustic wave device 10 is manufactured in the structure of a SAW filter, as in the illustrated embodiment, the wiring layer 121 may be formed of an aluminum (Al) material. In this case, the wiring layer 121, which is exposed externally, may be simultaneously removed in a photolithography or etching operation which is subsequently performed. Therefore, in order to prevent the wiring layer 121 from being simultaneously removed, the acoustic wave device 10 includes the plating layer 123 formed on the exposed wiring layer 121 as a barrier layer.

However, in the case in which the acoustic wave device is manufactured in the structure of a BAW filter, since the wiring layer 121 is formed of a molybdenum (Mo) or gold (Au) material which is not easily removed in the etching operation, the plating layer 123 or the seed layer 122, and an operation of forming the plating layer 123 and the seed layer 122, may be omitted.

Next, in operation (S6), a supporting layer 201 is formed on the one surface of the substrate 100. Subsequently, in operation (S7), the supporting layer 201 is partially removed to form a support part 200 along a circumference of the acoustic wave generating part 110.

The support part 200 may be formed of an insulating material such as a resin or polymer. However, the support part 200 may also be formed of a metal material, as needed. In addition, the support part 200 may be formed by a photolithography method. However, the support part 200 is not limited to the foregoing examples.

The support part 200 partially covers the electrode pad 120 and the ground pad 120a along edges of the electrode pad 120 and the ground pad 120a. Therefore, the electrode pad 120 and the ground pad 120a are exposed externally through through-holes 205 formed in the support part 200.

Next, in operation (S8), the shielding member 300 is stacked on the support part 200. The shielding member 300 is spaced apart from the acoustic wave generating part 110 by a predetermined interval, and is seated on the support part 200.

The shielding member 300 may be formed of a metal sheet. For example, the shielding member may be formed of a copper (Cu) sheet. The metal sheet may have a wide area, and the shielding member 300 may be formed in a size and shape capable of simultaneously covering a plurality of acoustic wave generating parts 110, as illustrated in FIG. 3. Therefore, since an area which is in contact with the support part 200 and supported is similar to or greater than an area forming the spacing region d, a flat sheet shape may be maintained even though the shielding member 300 is stacked on the support part 200.

Next, in operation (S9), a mask layer 303 is formed on the shielding member 300 to pattern the shielding member 300. Operation (S9) may also be performed by a photolithography method.

Accordingly, the shielding member 300 includes at least one shielding part 320 disposed over the acoustic wave generating part 110, and a connection part 310 disposed over the ground pad 120a. The shielding part 320 of the shielding member 300 is spaced apart from the acoustic wave generating part 110 by the support part 200. In addition, the connection part 310 and the ground pad 120a are also be spaced apart from each other by the support part 200.

The connection part 310 is formed to protrude from the support part 200 by a predetermined distance in a center direction of the ground pad 120a. Therefore, the support part 200 is not disposed between the protruding portion and the ground pad 120a.

However, the configuration of the shielding member 300 and the support part 200 is not limited to the above description. For example, as an example illustrated in FIGS. 4 and 8, the shielding member 300 may also be disposed on the same vertical line as the support part 200 in the area over the ground pad 120a, or the support part 200 may also be formed to protrude over the ground pad 120a more than the shielding member 300.

Next, in operation (S10), the sealing part 400 sealing the shielding member 300 and the support part 200 is formed. The sealing part 400 may be formed of a thin film layer of an insulating material, as described above.

The operation of forming the sealing part 400 may include applying a sealing layer (not shown) on the entirety of the one surface of the substrate 100 on which the shielding member 300 is disposed, and removing a portion of the sealing layer by a photolithography method to partially expose the shielding member 300.

The sealing part 400 may be formed by a vapor deposition method. For example, the sealing part 400 is formed by a physical vapor deposition (PVD) method or a chemical vapor deposition (CVD) method.

More specifically, the sealing part 400 may be formed by using any one of a sputtering method, an E-beam evaporation method, a thermal evaporation method, a laser molecular beam epitaxy (L-MBE) method, a pulsed laser deposition (PLD) method, a metal-organic chemical vapor deposition (MOCVD) method, a hydride vapor phase epitaxy (HVPE) method, and a plasma enhanced chemical vapor deposition (PECVD) method. Further, the removal of the sealing part 400 may be performed by an etching method.

Next, the acoustic wave device illustrated in FIG. 1 may be completed by forming the connection terminal 500 on the electrode pad 120, and forming the ground terminal 500a on the ground pad 120a. The operation of forming the connection terminal 500 and the ground terminal 500a may be performed by applying conductive paste on the electrode pad 120 and the ground pad 120a, and then melting and curing the applied conductive paste.

In this operation, the ground terminal 500a is bonded to both of the ground pad 120a and the shielding member 300. Therefore, the ground terminal 500a electrically connects the ground pad 120a and the shielding member 300 to each other. On the other hand, the connection terminal formed on the electrode pad 120 is only bonded to the electrode pad 120, and is not bonded to the shielding member 300.

The acoustic wave device 10 electrically connects the shielding member 300 and the ground pad 120a to each other using the ground terminal 500a. Therefore, a separate operation or configuration for connecting the shielding member 300 to a ground of the substrate 100 is not required.

Figure 7:
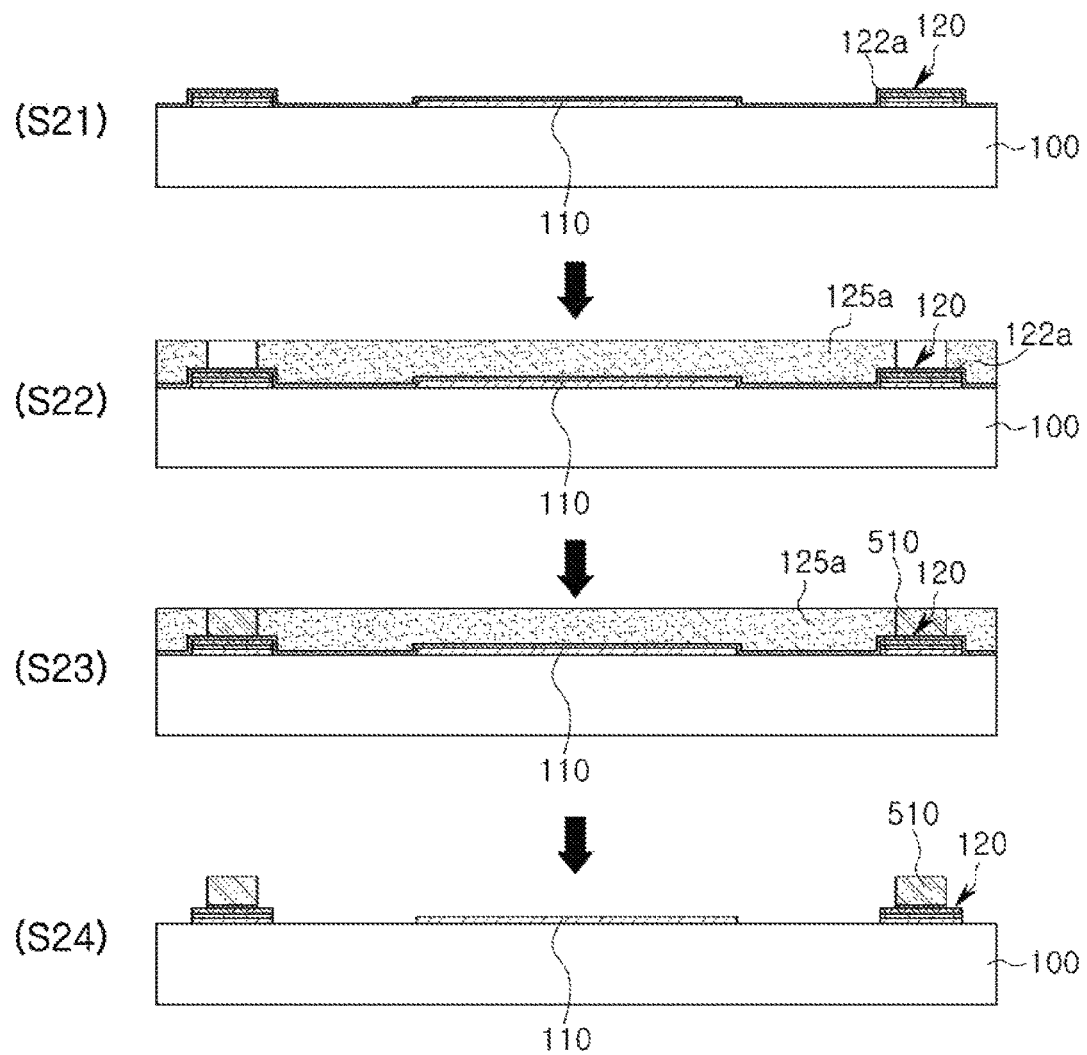
FIGS. 7 and 8 are views illustrating a method for manufacturing the acoustic wave device illustrated in FIG. 4, according to an embodiment.
Figure 8:
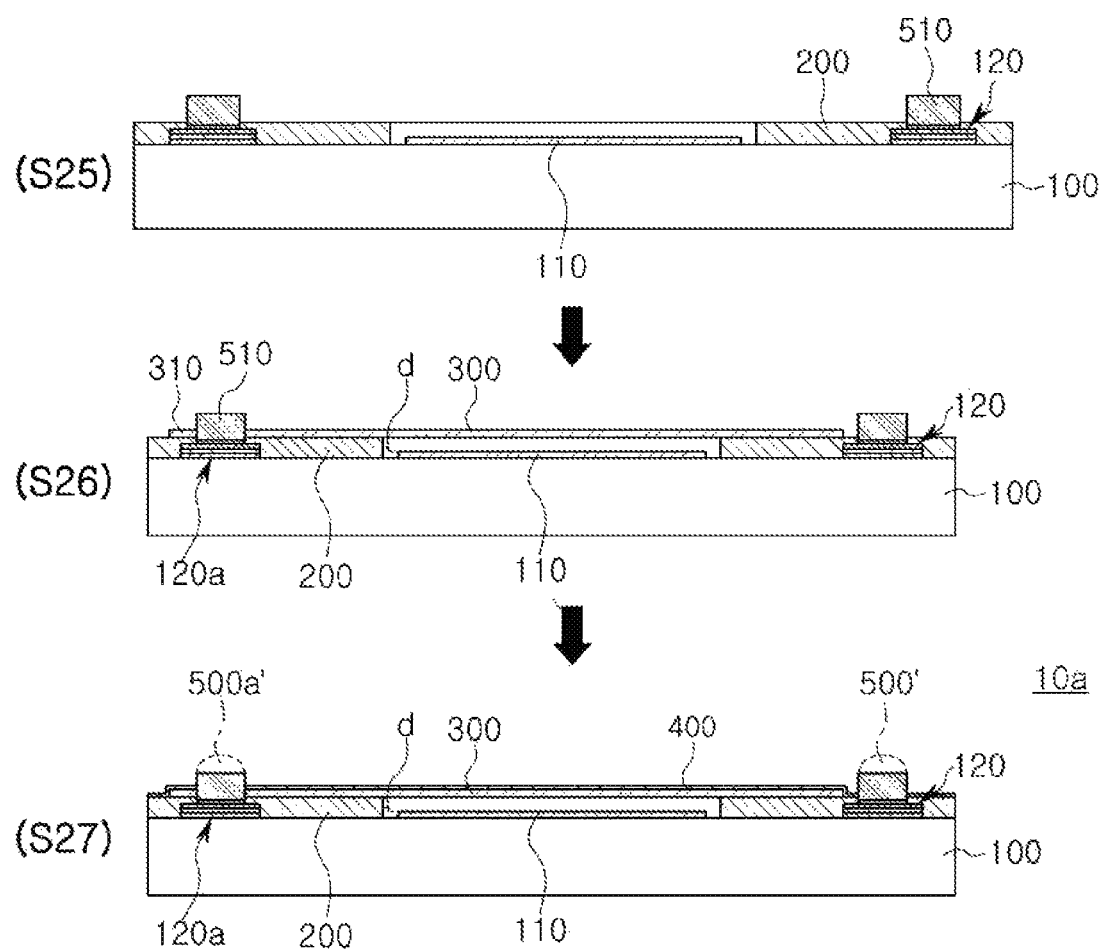

FIGS. 7 and 8 are views illustrating a method for manufacturing the acoustic wave device 10a illustrated in FIG. 4, according to an embodiment. The method for manufacturing the acoustic wave device 10a includes the operations (51) through (S5) described in the embodiment FIG. 5, which include completing the electrode pad 120 and the ground pad 120a.

Referring to FIGS. 7 and 8, following the operation (S5), a seed layer 122a is formed on the substrate 100 in operation (S21). The seed layer 122 is provided to form a connection conductor 510 to be described below by a plating operation, and may be formed of a copper (Cu) material by a sputtering method. However, the seed layer 122 is not limited to such an example.

The insulating protection layer may be formed on the acoustic wave generating part 110 and the wiring patterns as described above with respect to the embodiment of FIGS. 5 and 6. Therefore, the seed layer 122a may be substantially formed on a surface of the insulating protection layer, and the electrode pad 120 and the ground pad 120a may be exposed externally of the insulating protection layer.

Next, in operation (S22), a mask layer 125a is formed on the seed layer 122a. Then, the mask layer 125a is partially removed so that a portion of the seed layer 122a is exposed. Accordingly, the seed layer 122a formed on the electrode pad 120 and the ground pad 120a is exposed externally.

Next, in operation (S23), a conductive material is filled on the exposed seed layer 122a to form the connection conductor. The connection conductor 510 is formed by electroplating using the seed layer 122a. However, the connection conductor 510 is not limited to such an example. The connection conductor 510 may also be formed by using electroless plating, as needed.

The connection conductor 510 may be formed of a copper (Cu) material. However, the connection conductor 510 may be formed of another material.

Next, in operation (S24), the remainder of the mask layer 125a and portions of the seed layer 122a are removed. In particular, portions of the seed layer 122a formed on regions other than the electrode pad 120 and the ground pad 120a are removed. Accordingly, the connection conductor 510 is completed on the electrode pad 120 and the ground pad 120a.

Next, in operation (S25), the support part 200 is formed on the one surface of the substrate 100 on which the electrode pad 120 and the ground pad 120a are formed. Subsequently, in operation (S26), the shielding member 300 is formed on the support part 200. Similar to the embodiment of FIGS. 5 and 6, the shielding member 300 may be formed of a metal sheet, and may be formed of a copper (Cu) material. However, the shielding member 300 is not limited to such an example.

The shielding member 300 is spaced apart from the acoustic wave generating part 110 by a predetermined interval, and is seated on the support part 200. In addition, the connection part 310 is in contact with the connection conductor 510.

Next, in operation (S27), the sealing part 400 sealing the shielding member 300 and the support part 200 is formed. The sealing part 400 may be formed of a thin film layer of an insulating material by the vapor deposition method, as described above with respect to the embodiment of FIGS. 5 and 6. An end of the connection conductor 510 protrudes externally of the sealing part 400.

Next, in operation (S27), the acoustic wave device 10a is completed through an operation (S27) of forming a terminal part 520 at the end of the connection conductor 510.

The acoustic wave device 10a and the method for manufacturing the acoustic wave device 10a may be applied to a case in which the connection terminals 500' or the ground terminals 500a' are disposed at narrow intervals. In the case of embodiments in which the connection conductor 510 is not used (see FIG. 2), the connection terminal 500 is formed directly on the electrode pad 120, and the ground terminal 500a is formed directly on the ground pad 120a. Therefore, in a case in which connection terminals 500 or ground terminals 500a are disposed to be adjacent to each other, the connection terminals 500 or ground terminals 500a which are adjacent to each other may be inadvertently connected to each other in the operation of melting and curing the applied conductive paste.

However, in a case in which the terminal part 520 is formed at the end of the connection conductor 510 after the connection conductor 510 is formed, as in the embodiment of FIG. 4, the terminal part 520 may be formed to have a size corresponding to an area of the end of the connection conductor 510. Therefore, connection terminals 500' or ground terminals 500a' which are adjacent to each other may not be connected to each other. Accordingly, such an embodiment may be easily applied to a case in which an interval between the connection terminals 500' or the ground terminals 500a' is very narrow.

Figure 9:
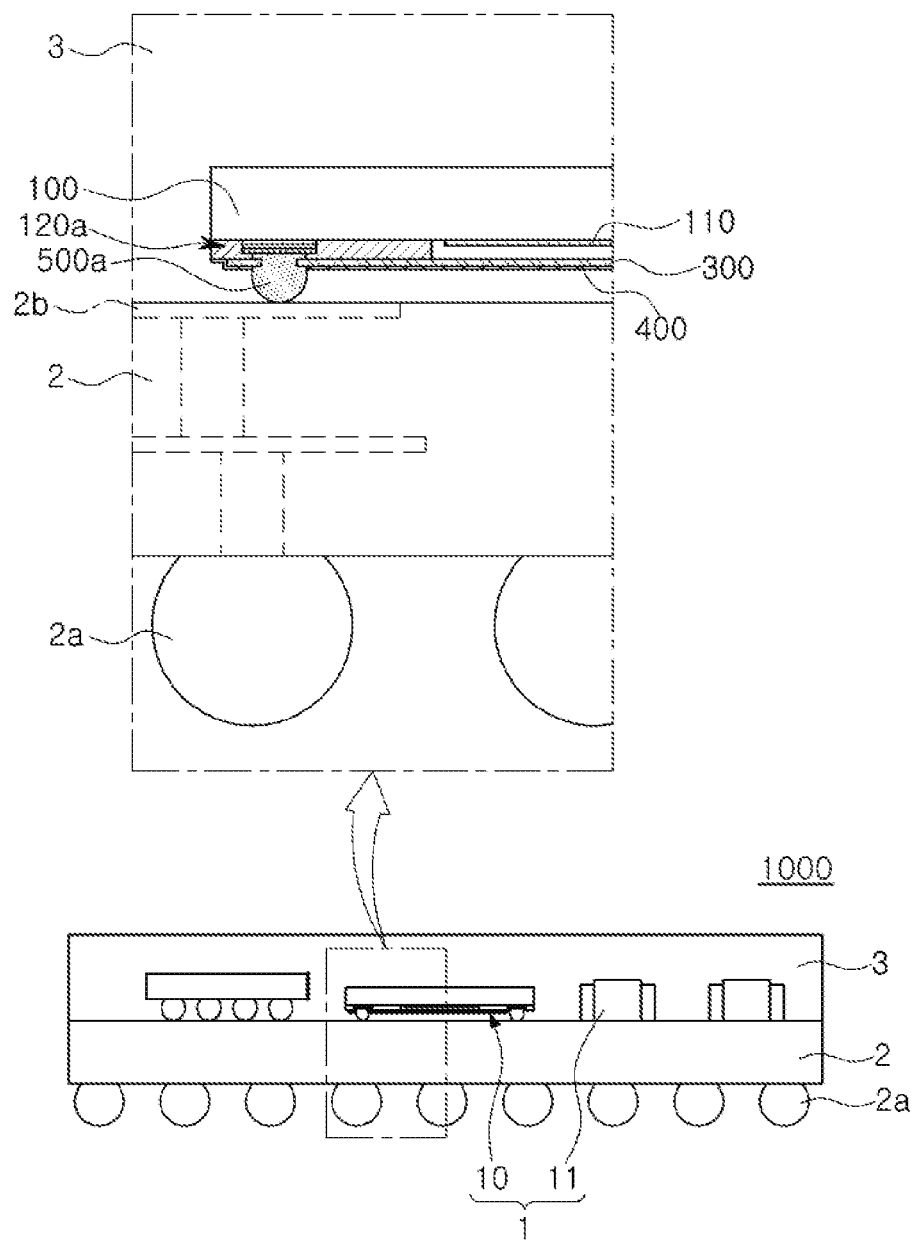
FIG. 9 is a cross-sectional view schematically illustrating an acoustic wave device package, according to an embodiment.

FIG. 9 is a cross-sectional view schematically illustrating an acoustic wave device package 1000, according to an embodiment. Referring to FIG. 9, the acoustic wave device package 1000 includes a package substrate 2, electronic elements 1 mounted on the package substrate 2, and a sealing part 3.

As long as the electronic elements 1 are electronic components which may be mounted on the package substrate 2, electronic elements 1 of any type may be used. For example, the electronic elements 1 are active elements or passive elements.

In addition, the electronic elements 1 include at least one acoustic wave device 10 and other elements 11. FIG. 9 illustrates a case in which the acoustic wave device 10 illustrated in FIG. 1 is used. However, the configuration of the acoustic wave device package 1000 is not limited to the illustrated example. In another embodiment, the acoustic wave device package 1000 may include the acoustic wave device 10a illustrated in FIG. 4.

Various kinds of substrates (e.g., a ceramic substrate, a printed circuit board, a glass substrate, or a flexible substrate) well known in the art may be used for the package substrate 2, and at least one electronic element 1 is mounted on at least one surface of the package substrate 2. In addition, external connection terminals 2a are disposed on a surface of the package substrate 2 other than a surface of the package substrate 2 on which the at least one electronic element 1 is mounted. For example, the external connection terminals 2a are mounted on a surface that is opposite to a surface on which the electronic elements 1 are mounted.

The sealing part 3 seals the electronic elements 1 mounted on the package substrate 2. In addition, the sealing part 3 is filled between the electronic elements 1 mounted on the package substrate 2 to prevent an occurrence of an electrical short circuit between the electronic elements 1, and encloses the outside of the electronic elements 1 and fixes the electronic elements 1 to the package substrate 2 to thereby safely protect the electronic elements 1 from external impact.

The sealing part 3 may be formed by a molding method. For example, an epoxy mold compound (EMC) is used as a material of the sealing part 3. However, the sealing part 3 is not limited to such an example. Various methods such as a method of compressing a semi-cured state resin may be used to form the sealing part 3, as needed.

The acoustic wave device package 1000 includes the acoustic wave device substrate 100 and the package substrate 2 disposed parallel to each other, and the shielding member 300 disposed between acoustic wave device substrate 100 and the package substrate 2. In addition, the acoustic wave generating part 110 is disposed between the shielding member 300 and the acoustic wave device substrate 100.

In addition, in the acoustic wave device package 1000, the shielding member 300 is directly connected to a ground 2b of the package substrate 2 through the ground terminal 500a, not through the substrate 100.

As set forth above, according to the embodiments disclosed herein, an acoustic wave device may easily connect a shielding member performing a shielding function to a ground terminal. As a result, the acoustic wave device may be easily manufactured.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave device comprising:
   a substrate;
   an acoustic wave generating part disposed on a surface of the substrate;
   a ground pad disposed on the surface of the substrate;
   a support part spaced apart from the acoustic wave generating part on the surface of the substrate;
   a shielding member disposed on the support part, and spaced apart from the acoustic wave generating part; and
   a ground terminal disposed on the ground pad and connecting the ground pad to the shielding member,
   wherein the ground terminal and the ground pad are electrically connected to each other in the support part.

2. The acoustic wave device of claim 1, wherein the support part is disposed between the ground pad and the shielding member.

3. The acoustic wave device of claim 1, wherein the ground terminal comprises a solder bump or a solder ball.

4. The acoustic wave device of claim 1, wherein the ground terminal comprises:
   a connection conductor disposed on the ground pad in pillar form; and
   a terminal part disposed at an end of the connection conductor.

5. The acoustic wave device of claim 4, wherein the shielding member is bonded to the connection conductor.

6. The acoustic wave device of claim 1, further comprising a sealing part disposed along surfaces of the shielding member and the support part.

7. The acoustic wave device of claim 6, wherein:
   the shielding member comprises a portion exposed externally of the sealing part; and
   the ground terminal is bonded to the portion exposed externally of the sealing part.

8. The acoustic wave device of claim 1, wherein:
   the shielding member comprises a ring-shaped connection part having a through-hole; and
   the ground terminal is received in the through-hole, and is electrically connected to the connection part.

9. A method to manufacture an acoustic wave device, the method comprising:
   forming an acoustic wave generating part on a surface of a substrate;
   forming a ground pad on the surface of the substrate;
   forming a support part to be spaced apart from the acoustic wave generating part on the surface of the substrate;
   disposing a shielding member on the support part; and
   forming a ground terminal on the ground pad to connect the ground pad to the shielding member, and to be electrically connected to the ground pad in the support part.

10. The method of claim 9, wherein the forming of the support part comprises disposing the support part partially on the ground pad such that a portion of the ground pad is exposed externally of the support part.

11. The method of claim 9, further comprising, after the disposing of the shielding member on the support part, forming a sealing part along surfaces of the shielding member and the support part.

12. The method of claim 11, wherein:
   the forming of the sealing part comprises removing a portion of the sealing part to expose a portion of the shielding member externally of the sealing part; and
   the ground terminal is attached to the portion of the shielding member.

13. The method of claim 9, wherein the forming of the shielding member comprises forming the shielding member such that a portion of the shielding member protrudes externally of the support part over the ground pad.

14. The method of claim 9, wherein the forming of the ground terminal comprises:
   disposing a conductive member on the ground pad; and
   melting and curing the conductive member.

15. The method of claim 9, wherein the forming of the ground terminal comprises:
   disposing a connection conductor having a pillar form on the ground pad; and
   forming a terminal part at an end of the connection conductor.

16. A method to manufacture an acoustic wave device, the method comprising:
   forming an acoustic wave generating part on a surface of a substrate;
   forming a ground pad on the surface of the substrate;
   forming a connection conductor having a pillar form on the ground pad;

forming a support part to be spaced apart from the acoustic wave generating part on the surface of the substrate;

disposing a shielding member on the support part and connecting the shielding member to the connection conductor; and forming a terminal part at an end of the connection conductor.

17. The method of claim 16, wherein the disposing of the shielding member on the support part comprises positioning the shielding member to be spaced apart from the acoustic wave generating part in a direction perpendicular to the surface of the substrate.

18. An acoustic wave device comprising:

a substrate;

an acoustic wave generating part disposed on a surface of the substrate;

a ground pad disposed on the surface;

a support part spaced apart from the acoustic wave generating part on the surface;

a shielding member disposed on the support part, and spaced apart from the acoustic wave generating part; and a ground terminal disposed on the ground pad, penetrating through the shielding member, and connecting the ground pad to the shielding member.

* * * * *